(12) United States Patent
Hashemi et al.

(10) Patent No.: US 9,917,200 B2
(45) Date of Patent: Mar. 13, 2018

(54) NANOWIRE TRANSISTOR STRUCTURES WITH MERGED SOURCE/DRAIN REGIONS USING AUXILIARY PILLARS

(71) Applicant: International Business Machines Corporation, Armonk, NY (US)

(72) Inventors: Pouya Hashemi, White Plains, NY (US); Ali Khakifirooz, Mountain View, CA (US); Alexander Reznicek, Troy, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

(21) Appl. No.: 15/469,494

(22) Filed: Mar. 25, 2017

(65) Prior Publication Data

US 2017/0200832 A1    Jul. 13, 2017

Related U.S. Application Data

(60) Division of application No. 14/935,406, filed on Nov. 7, 2015, now Pat. No. 9,608,063, which is a continuation of application No. 14/181,564, filed on Feb. 14, 2014, now Pat. No. 9,257,527.

(51) Int. Cl.
*H01L 29/06* (2006.01)
*H01L 29/786* (2006.01)
*H01L 27/092* (2006.01)
*H01L 29/423* (2006.01)
*H01L 21/8238* (2006.01)

(52) U.S. Cl.
CPC .......... *H01L 29/78618* (2013.01); *H01L 21/823807* (2013.01); *H01L 21/823814* (2013.01); *H01L 21/823828* (2013.01); *H01L 27/092* (2013.01); *H01L 29/0673* (2013.01); *H01L 29/42392* (2013.01); *H01L 29/78696* (2013.01)

(58) Field of Classification Search
CPC combination set(s) only.
See application file for complete search history.

(56) References Cited

U.S. PATENT DOCUMENTS

| | | | |
|---|---|---|---|
| 7,432,139 | B2 | 10/2008 | Currie |
| 7,821,061 | B2 | 10/2010 | Jin |
| 8,063,450 | B2 | 11/2011 | Wernersson |
| 8,212,336 | B2 | 7/2012 | Goebel |
| 8,344,361 | B2 | 1/2013 | Wernersson |
| 8,384,065 | B2 | 2/2013 | Bangsaruntip |
| 8,728,885 | B1 | 5/2014 | Pham |
| 8,785,909 | B2 | 7/2014 | Radosavljevic |

(Continued)

FOREIGN PATENT DOCUMENTS

| | | |
|---|---|---|
| WO | WO2012085715 | 6/2012 |
| WO | WO2013095652 | 6/2013 |
| WO | WO2014018201 | 1/2014 |

*Primary Examiner* — Telly Green
(74) *Attorney, Agent, or Firm* — Louis J. Percello; Otterstedt, Ellenbogen & Kammer, LLP

(57) ABSTRACT

A nanowire transistor structure is fabricated by using auxiliary epitaxial nucleation source/drain fin structures. The fin structures include semiconductor layers integral with nanowires that extend between the fin structures. Gate structures are formed between the fin structures such that the nanowires extend through the gate conductors. Following spacer formation and nanowire chop, source/drain regions are grown epitaxially between the gate structures.

12 Claims, 15 Drawing Sheets

- $W_{NW}$<5nm (nanowire width), $H_{NW}$<5nm (nanowire height)
- $L_G$ <10nm (gate length)
- $T_{spacer}$ <5nm (spacer thickness)
- $W_{AP}$ <10nm (width auxiliary pillar)
- CPP=$W_{AP}$ +$L_G$+4$t_{spacer}$+2*Gap
- – CPP=10+10+20+2Gap=40+2Gap
- – Typical CPP=45-50nm

(56) References Cited

U.S. PATENT DOCUMENTS

| | | |
|---|---|---|
| 8,785,981 B1 | 7/2014 | Chang |
| 8,900,959 B2 | 12/2014 | Chang |
| 9,006,087 B2 | 4/2015 | Chang |
| 9,257,527 B2 | 2/2016 | Hashemi |
| 2009/0236658 A1 | 9/2009 | Gruening-Von Schwerin |
| 2010/0207208 A1 | 8/2010 | Bedell |
| 2010/0295021 A1 | 11/2010 | Chang |
| 2011/0089400 A1 | 4/2011 | Ohlsson |
| 2011/0133165 A1 | 6/2011 | Bangsaruntip |
| 2012/0138886 A1 | 6/2012 | Kuhn |
| 2012/0319178 A1 | 12/2012 | Chang |
| 2013/0153993 A1 | 6/2013 | Chang |
| 2013/0153996 A1 | 6/2013 | Chang |
| 2013/0161756 A1 | 6/2013 | Glass |
| 2013/0270512 A1 | 10/2013 | Radosavljevic |
| 2014/0042386 A1 | 2/2014 | Cea |
| 2014/0091279 A1 | 4/2014 | Kachian |
| 2014/0151638 A1 | 6/2014 | Chang |
| 2014/0151639 A1 | 6/2014 | Chang |
| 2014/0225065 A1 | 8/2014 | Rachmady |
| 2014/0264276 A1 | 9/2014 | Chang |
| 2015/0053928 A1 | 2/2015 | Ching |
| 2015/0236120 A1 | 8/2015 | Hashemi |
| 2016/0064482 A1 | 3/2016 | Hashemi |

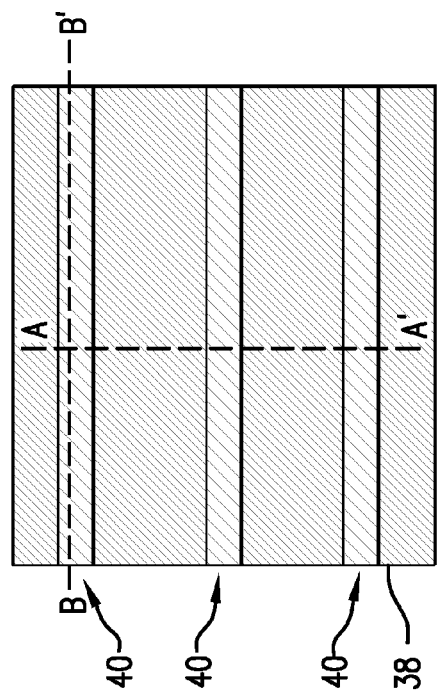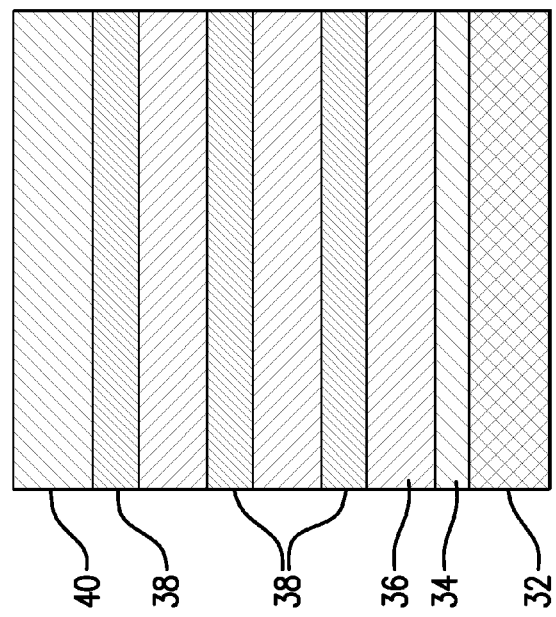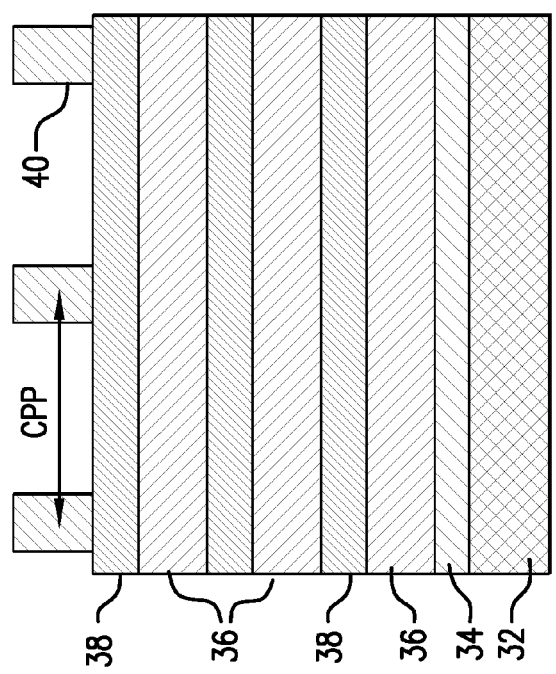

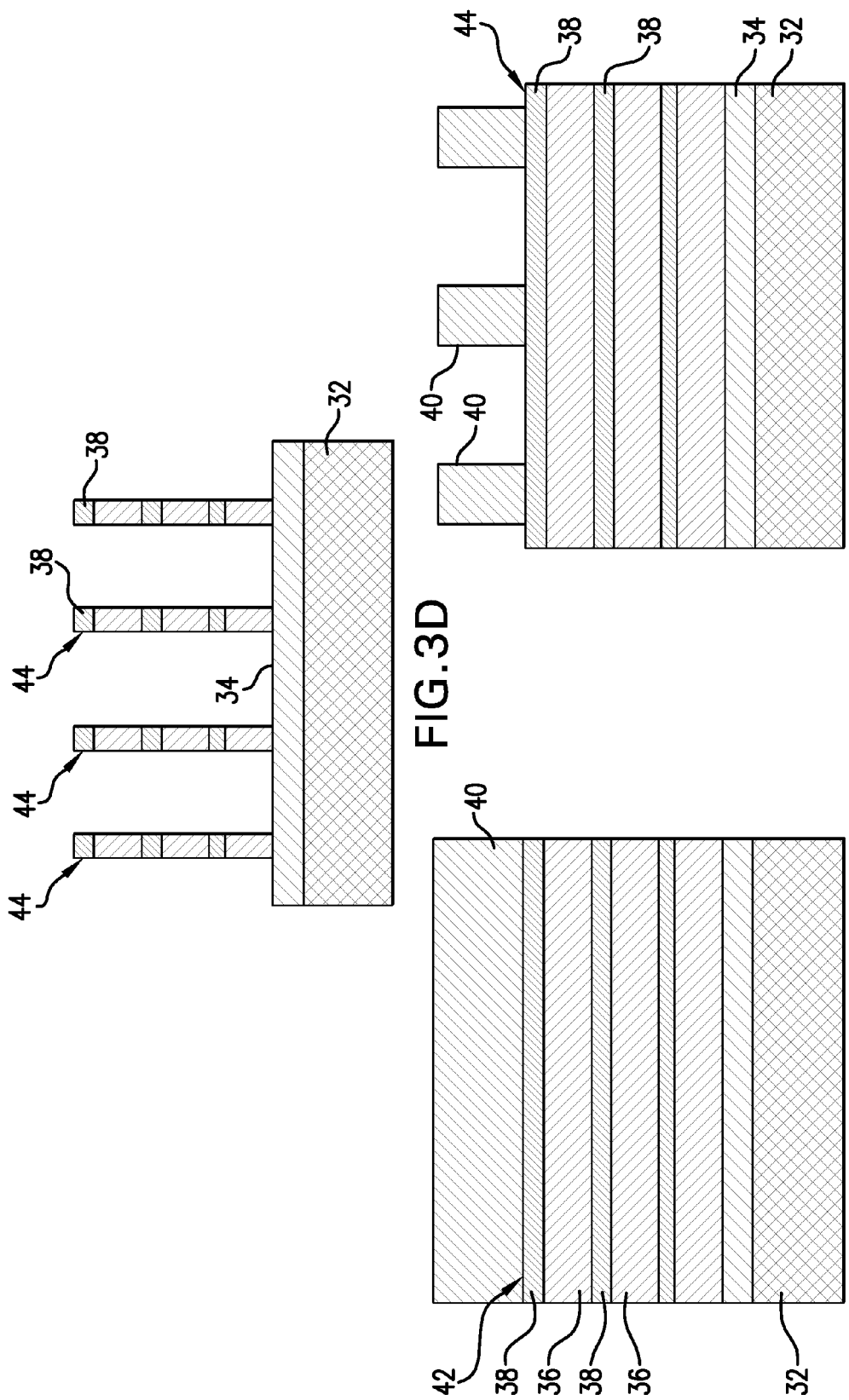

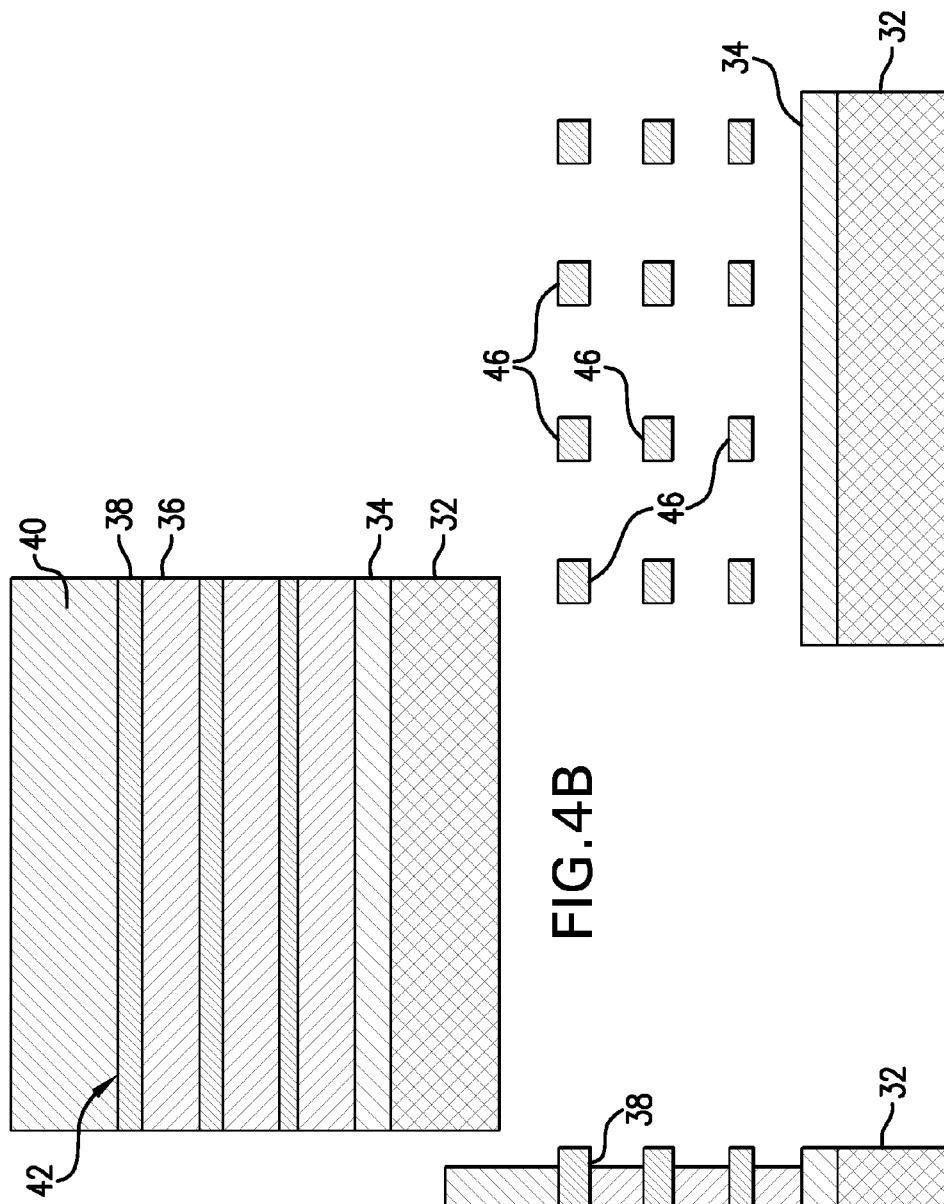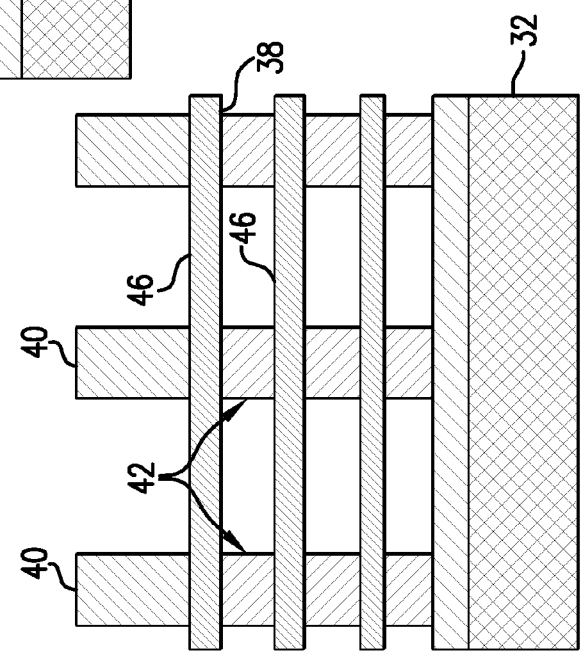

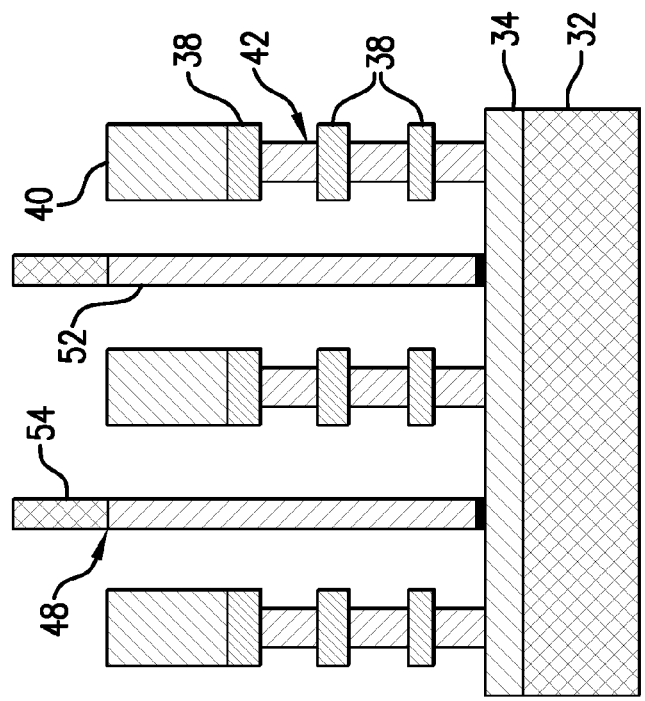
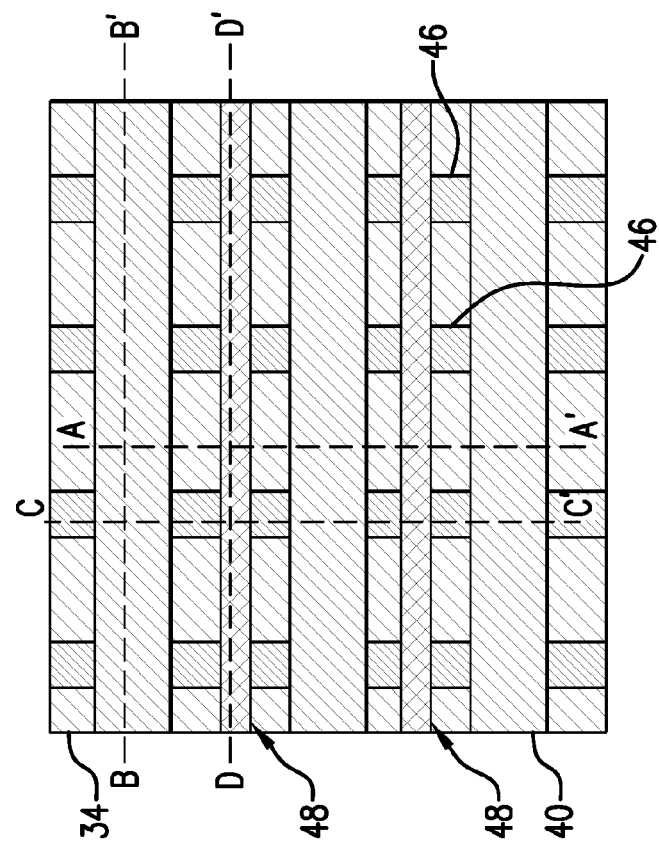
FIG. 5A
FIG. 5

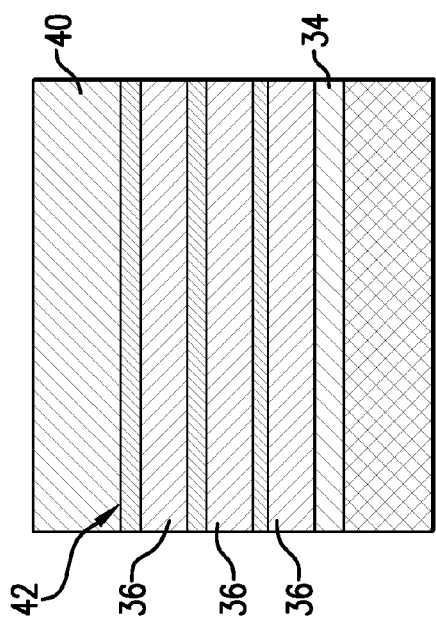
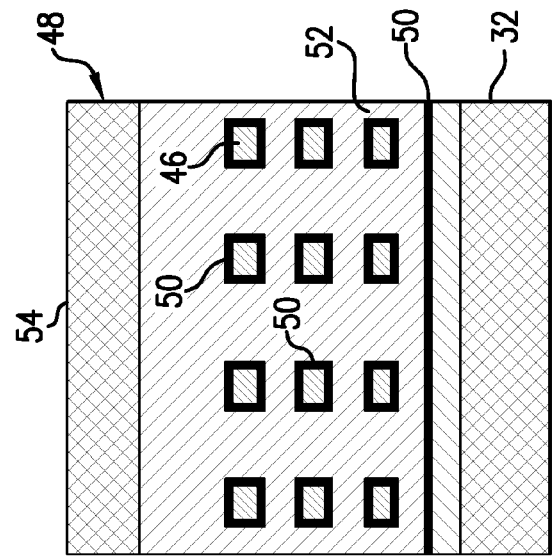
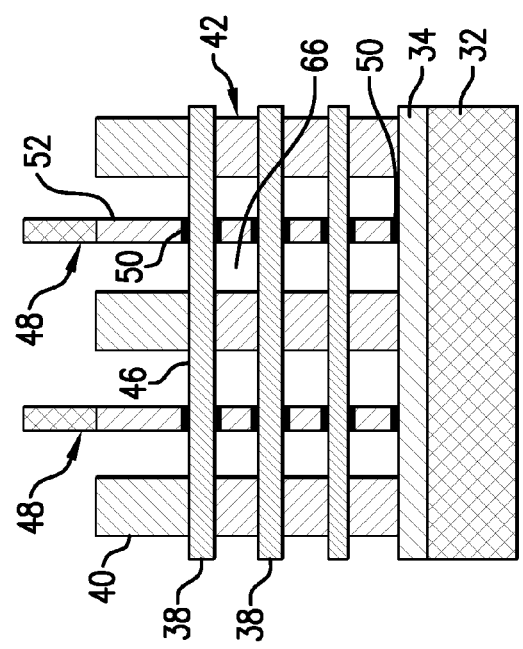
FIG.5B
FIG.5D
FIG.5C

- $W_{NW}$ <5nm (nanowire width), $H_{NW}$ <5nm (nanowire height)
- $L_G$ <10nm (gate length)
- $T_{spacer}$ <5nm (spacer thickness)
- $W_{AP}$ <10nm (width auxiliary pillar)
- CPP=$W_{AP}$+$L_G$+4$t_{spacer}$+2*Gap
- CPP=10+10+20+2Gap=40+2Gap
- Typical CPP=45–50nm

NANOWIRE TRANSISTOR STRUCTURES WITH MERGED SOURCE/DRAIN REGIONS USING AUXILIARY PILLARS

CROSS-REFERENCE TO RELATED APPLICATION

This application is a divisional of U.S. patent application Ser. No. 14/935,406 filed Nov. 7, 2015, which is in turn a continuation of U.S. patent application Ser. No. 14/181,564 filed Feb. 14, 2014, now U.S. Pat. No. 9,257,527. The complete disclosures of U.S. patent application Ser. No. 14/935,406 and U.S. patent application Ser. No. 14/181,564 are expressly incorporated herein by reference in their entireties for all purposes.

FIELD

The present disclosure relates to the physical sciences, and, more particularly, to field effect transistor (FET) structures and methods of fabrication thereof.

BACKGROUND

Gate-all-around (GAA) nanowire field effect transistors having small nanowire diameters are among the CMOS transistor architectures having advantageous device characteristics. For sub-10 nm gate lengths, replacement gate (RMG) processes can be challenging due to the small available volume and gate resistance constraints. The handling of nanowires in the source/drain regions after spacer reactive ion etch (ME) and cleaning the spacer under the wires in a stacked nanowire architecture is difficult. Methods have been proposed to chop the nanowires and regrow epitaxially from the nanowire corners. For sub-4 nm nanowire dimensions, source/drain epitaxial growth and merging the nanowires is difficult, particularly for pFET devices, due to the small available surface areas and facet issues.

SUMMARY

Principles of the present disclosure provide an exemplary fabrication method that includes obtaining a first structure including a base substrate, a plurality of gate structures on the base substrate, and a plurality of semiconductor fin structures on the base substrate, each of the gate structures including a gate conductor and one or more nanowires extending through the gate conductor, each fin structure including a plurality of semiconductor layers and being positioned between a pair of the gate structures The method further includes epitaxially growing source/drain regions between the gate structures such that the source/drain regions contact the one or more nanowires extending through the gate structures and one or more of the semiconductor layers of the fin structure.

A transistor structure provided in accordance with the principles of the present disclosure includes a base substrate and a plurality of gate structures on the base substrate, each of the gate structures including a gate conductor and one or more nanowires extending through the gate conductor. A plurality of fin structures are on the base substrate, each fin structure including an alternating sequence of first layers and at least one second semiconductor layer and being positioned between a pair of the gate structures. Epitaxial source/drain regions are positioned between the gate structures, the source/drain regions contacting the one or more nanowires extending through the gate structures and the at least one second semiconductor layer of the fin structure.

A further structure includes a base substrate and a plurality of gate structures on the base substrate, each of the gate structures including a gate conductor and a stacked nanowire architecture including a plurality of nanowires extending through the gate conductor thereof, the gate structures being separated by gaps. A plurality of fin structures are also on the base substrate in alternating sequence with the gate structures, each fin structure including an alternating sequence of first layers and second semiconductor layers, the second semiconductor layers being integral with the nanowires, the nanowires extending through the gaps.

As used herein, "facilitating" an action includes performing the action, making the action easier, helping to carry the action out, or causing the action to be performed. Thus, by way of example and not limitation, instructions executing on one processor might facilitate an action carried out by instructions executing on a remote processor, by sending appropriate data or commands to cause or aid the action to be performed. For the avoidance of doubt, where an actor facilitates an action by other than performing the action, the action is nevertheless performed by some entity or combination of entities.

CMOS structures and fabrication methods as disclosed herein can provide substantial beneficial technical effects. For example, one or more embodiments may provide one or more of the following advantages:

Overcome epitaxial growth limitations and source/drain contact formation with respect to sub-4 nm nanowire dimensions;

Facilitate fabrication of gate-all-around nanowire CMOS transistor structures.

These and other features and advantages will become apparent from the following detailed description of illustrative embodiments thereof, which is to be read in connection with the accompanying drawings.

BRIEF DESCRIPTION OF THE DRAWINGS

FIGS. 2 and 2A-B are schematic top plan and sectional views, the sectional views being taken along lines A-A' and B-B', respectively, showing auxiliary pads formed on the substrate;

FIGS. 3 and 3A-D are schematic top plan and cross sectional views, the sectional views being taken along lines A-A', B-B', C-C' and D-D', respectively, showing the structure of FIGS. 2 and 2A-B following fin formation;

FIGS. 4 and 4A-D are schematic top plan and cross sectional views, the sectional views being taken along lines A-A', B-B', C-C' and D-D', respectively, showing the structure of FIGS. 3 and 3A-D following nanowire suspension;

FIGS. 5 and 5A-D are schematic top plan and cross sectional views, the sectional views being taken along lines A-A', B-B', C-C' and D-D', respectively, showing the structure of FIGS. 4 and 4A-D following gate formation;

DETAILED DESCRIPTION

Fabrication of a gate-all-around nanowire transistor is facilitated by using auxiliary epitaxial nucleation source/drain fin structures formed as pillars on a substrate. The pillars are formed at the same level as the active region (RX) and have a pitch similar to the gate pitch (CPP) of the transistor to be fabricated.

Figure 1:
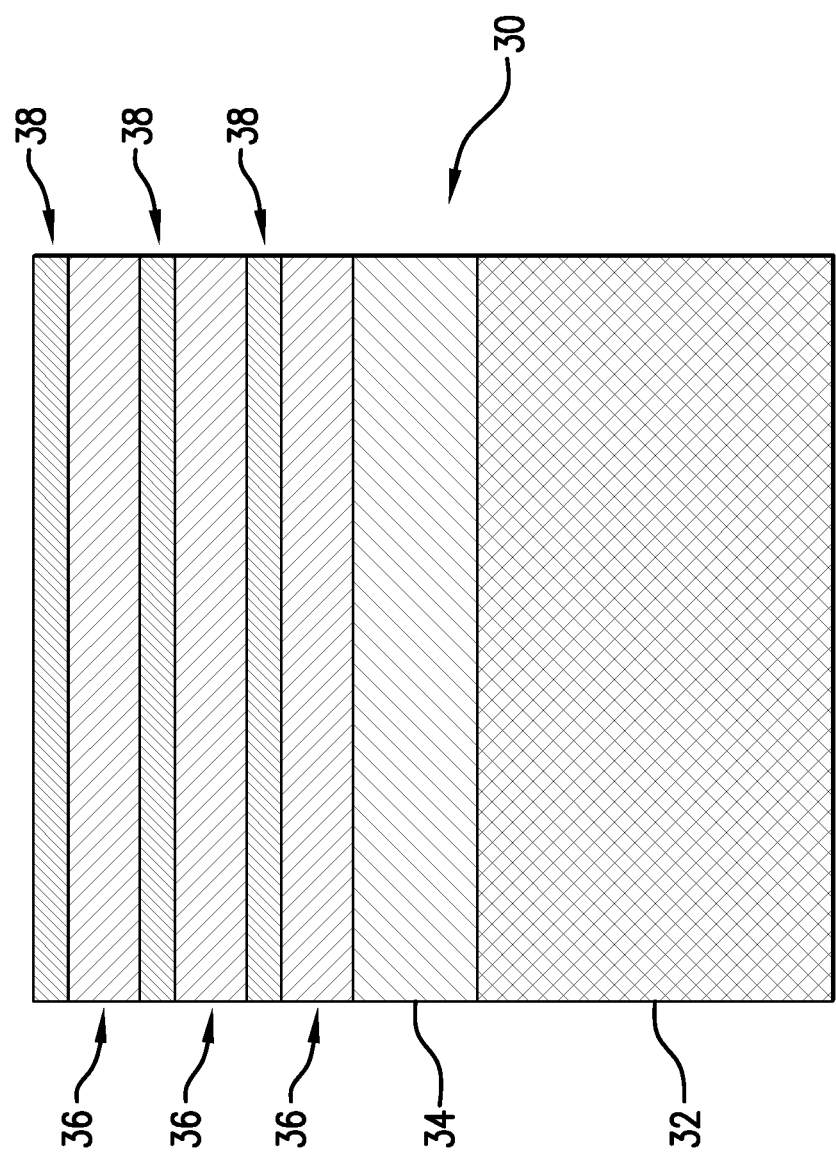
FIG. 1 is a schematic illustration of a starting substrate.

FIG. 1 illustrates a structure 30 that is employed in one or more embodiments as a starting substrate. The base layer 32 can be bulk silicon, silicon germanium, or germanium on silicon in some embodiments. Other semiconductor materials such as III-V compound semiconductor materials may be employed in some embodiments. Multilayers of the semiconductor materials can also be used to form the base layer 32. In some embodiments, the base layer is a non-semiconductor material including, for example, a dielectric material and/or a conductive material. An electrically insulating layer 34, such as silicon dioxide or a high-k oxide such as hafnium oxide, aluminum oxide, or combinations thereof is provided on the base layer. The two layers 32, 34 form an exemplary base substrate. In some embodiments, the layer 34 comprises a semiconductor material oppositely doped from the base layer 32.

An alternating sequence of semiconductor layers 36, 38 is provided on the base layer in accordance with one or more exemplary embodiments. The first layers 36 in such embodiments are formed from semiconductor materials that can be selectively etched with respect to the second semiconductor layers 38 formed in alternating sequence therewith. In some embodiments, the first layers 36 are silicon germanium layers and the second layers are crystalline silicon layers. Group III-V materials could alternatively be employed to form the layers 36, 38. In accordance with an exemplary method, germanium-containing layers such as silicon germanium (SiGe) layers 36 are grown epitaxially in alternating sequence with the silicon layers 38 using a blanket layer deposition process. "Blanket" deposition refers to the deposition of the layers without masking. Chemical vapor deposition (CVD) is among the known techniques for epitaxially depositing materials such as silicon germanium on crystalline silicon. Selective epitaxial growth, wherein layers 36, 38 are grown only in certain desired active regions, may alternatively be employed. In some embodiments, the silicon germanium layers 36 contain about fifteen to forty-five percent (15-45%) germanium and have thicknesses between about three to fifteen nanometers and more preferably between eight to ten nanometers. As discussed below, the distance between nanowires to be formed later in the process is likewise 3-15 nm, with 8-10 nm being preferred. The silicon layers 38 in one or more exemplary embodiments have thicknesses of about four to eight nanometers and preferably about four nanometers. This corresponds with the diameters of later-formed nanowires, which are 4-8 nm in some embodiments and about four nanometers in one or more embodiments. One of the silicon germanium layers 36 adjoins the electrically insulating layer 34 in the exemplary embodiment as illustrated while one of the silicon layers 38 forms the top layer of the starting substrate 30.

Referring to FIGS. 2, 2A and 2B, elongate auxiliary pads 40 are formed on the substrate 30. In one or more exemplary embodiments, a silicon nitride layer (not shown) is deposited on the top layer 38 and a mask is applied. The nitride layer is then etched to form the auxiliary pads 40. Reactive ion etching (ME) is one exemplary technique for removing selected portions of the nitride layer. In one or more exemplary embodiments, the pads 40 adjoin a silicon layer 38 or other semiconductor layer intended to remain substantially intact following selective etching of the semiconductor layers 36, 38 during subsequent processing. The pads 40 form a hard (e.g. silicon nitride ($Si_3N_4$)) mask. The spacing of the pads 40 is the same or nearly the same as the gate pitch (CPP) of the subsequently formed transistor structures.

Figure 3A:
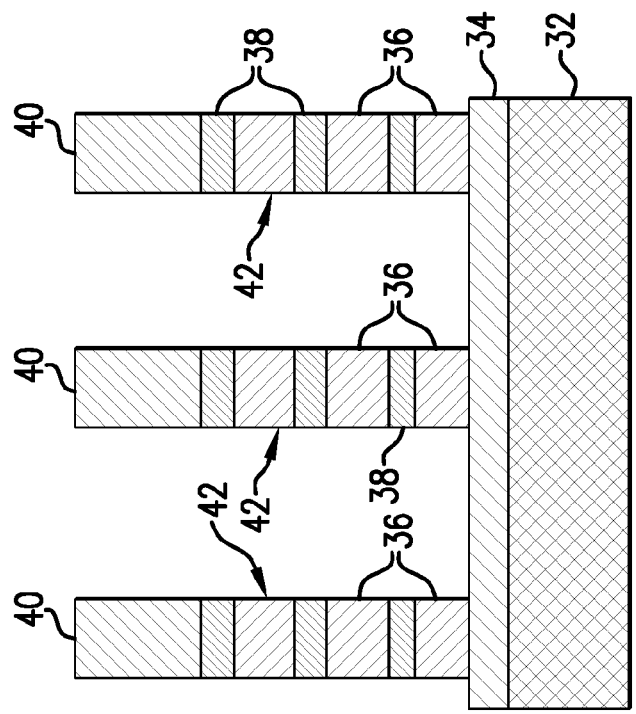
Figure 3:
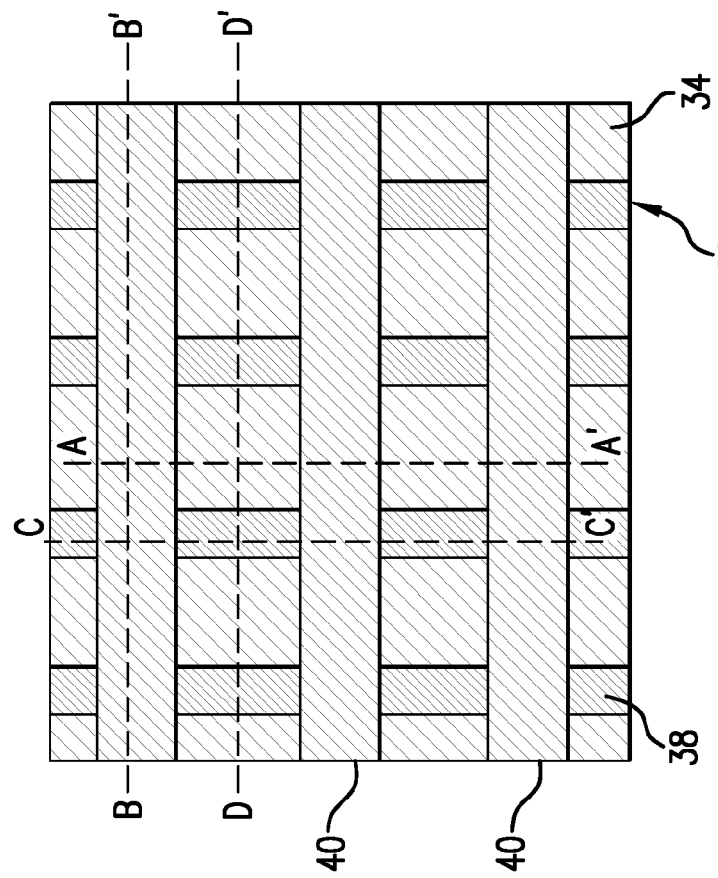

Fin structure (pillar) and fin formation follows deposition of the pads 40. As shown in FIGS. 3A and 3B, the portions of the layers 36, 38 beneath the pads 40 remain substantially intact, forming a set of fin structures 42 that adjoin the electrically insulating layer 34. Sidewall image transfer (SIT) is a known technique for forming fins within semiconductor materials. Sidewall image transfer (SIT) is one exemplary and conventional technique for defining fin thickness. U.S. Pub. No. 2012/0068264, which is incorporated by reference herein, discloses other techniques for forming narrow fins on semiconductor substrates that can be applied to the structures disclosed herein. A set of fins 44 that extend perpendicularly to the pads 40 and associated fin structures 42 is also formed using, for example, a SIT process, as shown schematically in FIGS. 3C and 3D. Different materials are used for the pads 40 and the SIT spacers. As known in the art, SIT spacers can comprise high-k materials. Alternatively, EUV (extreme ultraviolet) lithography can be employed rather than SIT. The top surface of the electrically insulating layer 34 is exposed between the fin structures 42 and fins 44, as shown in FIGS. 3, 3A and 3D. The heights of the fin structures 42 and fins 44 are 10-100 nm, with 20-50 nm being preferred in some embodiments. The lengths of the fins and fin structures can be any desired length. Referring to FIG. 3D, each side of the silicon layers 38 as shown in cross section is two to twenty nanometers (2 to 20 nm), with 4-8 nm preferred in some embodiments. The cross sections of the silicon layers 38 are square in some embodiments to make nanowires later in the process that will also be square in cross section after interlayer removal. The pads 40 are shifted by the half pitch (pitch=CPP as shown in FIG. 2A). CPP can be 15-500 nm, though CPP of 40 nm and higher is more feasible. The pads 40 are smaller in the lateral dimension shown in FIG. 3A than that of the layer contact areas defined by the top surface of the dielectric layer 34. For example, (CPP (e.g. 64 nm) minus gate length (e.g. 20 nm) minus two times gate spacer length (2×6 nm), leaves a space of 64−20−12=32, so an appropriate pad lateral dimension as shown in FIG. 3A would be 15-20 nm to leave sufficient room for epitaxy layer(s). Gate structures 48 and associated gate spacers 56 are discussed below with respect to FIGS. 5 and 5A-D and 6 and 6A-D.

Figure 4A:
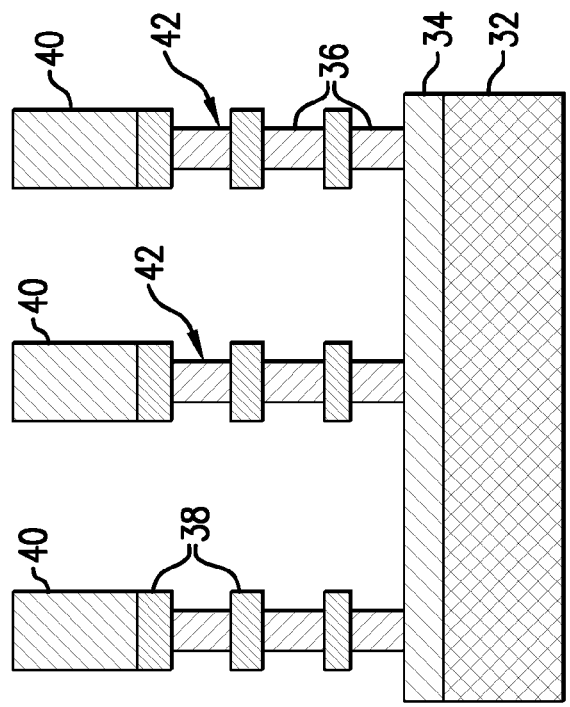
Figure 4:
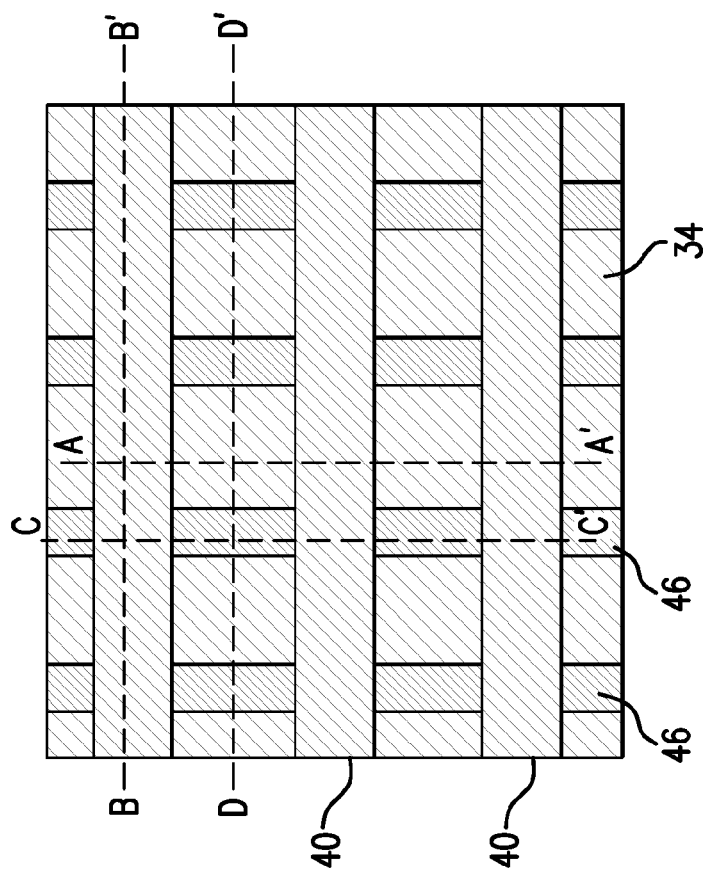
Figure 6A:
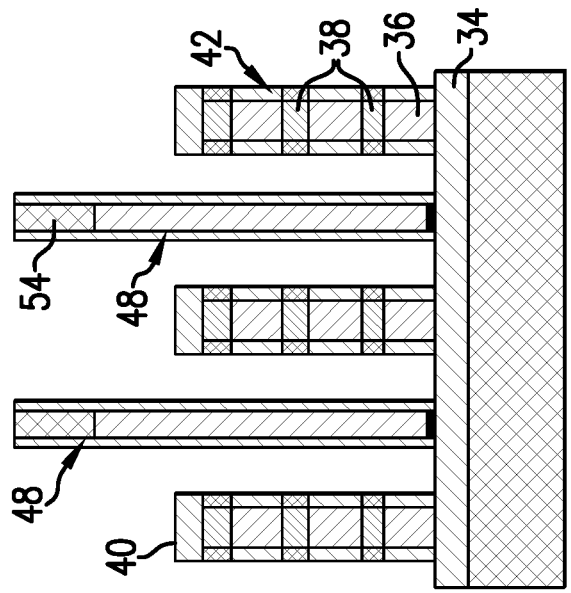
FIGS. 6 and 6A-D are schematic cross sectional views of the structure shown in FIGS. 5 and 5A-D following spacer formation and nanowire chop.
Figure 6:
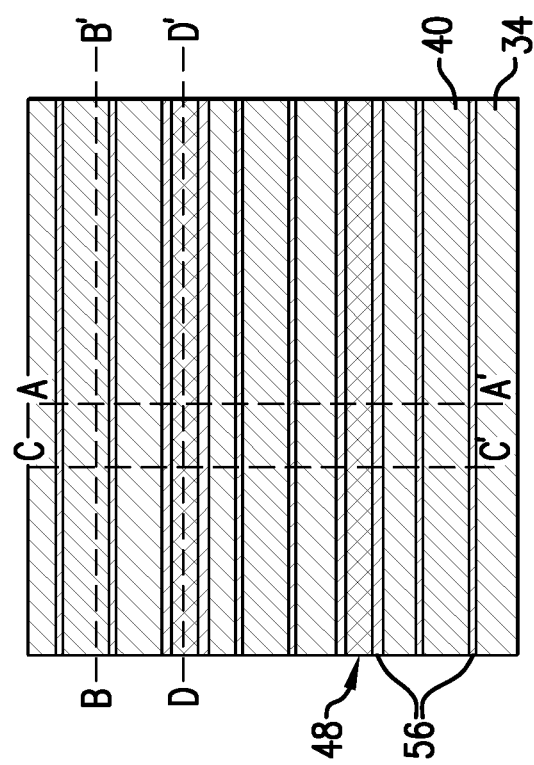
Figure 6D:
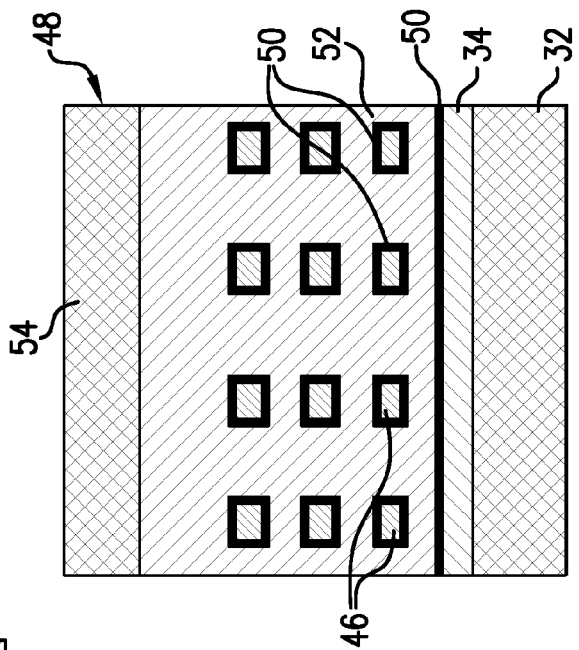
Figure 6B:
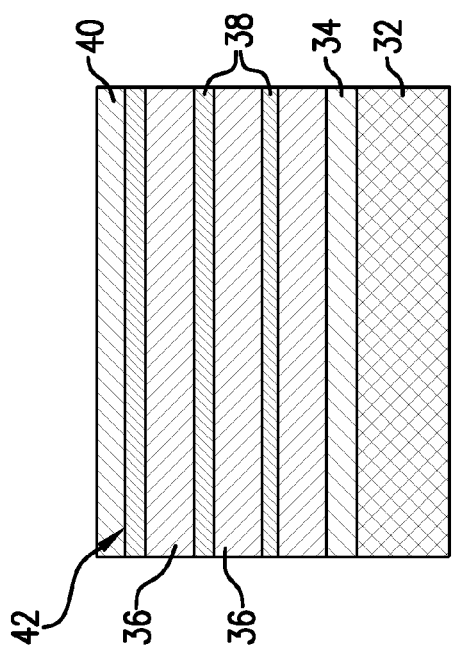
Figure 6C:
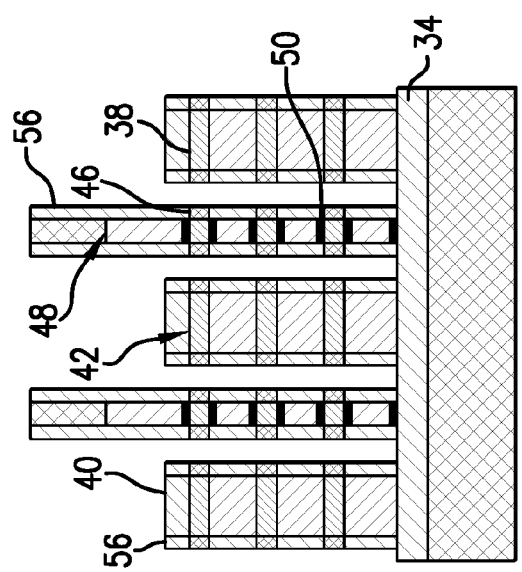

The structure shown in FIGS. 3 and 3A-D is subjected to selective etching to obtain the structure shown in FIGS. 4 and 4A-4D. It will be appreciated that the views provided in FIGS. 4 and 4A-D correspond, respectively, to those provided in FIGS. 3 and 3A-D following such processing. As discussed above, in some exemplary embodiments, silicon germanium layers 36 are formed in alternating sequence with silicon layers 38. Hydrogen chloride gas is employed in some embodiments to selectively remove silicon germanium, leaving the silicon layers 38 substantially intact. The fin structures 42 and fins 44 accordingly include silicon layers following fin formation. Selective, timed etching of the silicon germanium layers 36 with respect to the silicon layers causes the silicon germanium layers to be completely removed from some portions of the structure while remaining at least in part in the fin structures 42. This is due to the relative thickness of the fin structures with respect to the thicknesses of the fins 44. As shown in FIG. 4B, the thicknesses of the silicon germanium layers 36 of the fin structures 42 beneath the pads 40 are reduced by selective etching more than the thicknesses of the silicon layers 38 thereof. As shown in FIGS. 4C and 4D, the silicon germanium is removed from the fins 44 (FIGS. 3C, 3D). The silicon layers 38 of the sets of fin structures 42 and fins 44 remain intact. The silicon layers 38 formerly incorporated in the fins 44 accordingly form a stacked nanowire architecture, the individual nanowires 46 being suspended between the fin structures 42 as best shown in FIG. 4C. The nanowires 46 are integral with the silicon layers 38 of the fin structures 42, both structures being formed from the same layers 38 of the starting substrate 30. It will be appreciated that greater or fewer numbers of nanowires 46 than those shown in the exemplary illustrations may be formed. As further discussed above, selectively etchable semiconductor materials other than silicon and silicon germanium may be employed to form the semiconductor layers 36, 38 and nanowires 46.

Referring to FIGS. 5 and 5A-5D, gate structures 48 are formed between and parallel to the parallel pads 40 and associated semiconductor fin structures 42, forming a nanowire gate-all-around structure. A "gate first" process is employed in one or more exemplary embodiments. The gate conductor layers 52 are deposited on the structure by PVD, ALD, CVD or other suitable processes known to those of skill in the art. Excess gate material can be removed by etching or other subtractive process. The gate conductors may be comprised of metals such as TiN, TaN, W, WN, TaAlN, Al, Au, Ag, or a combination of such metals. Gate conductor layers may also include an electrically conductive (e.g. doped) polysilicon layer located over a metal material, whereby the top of the polysilicon layer may be silicided. Gate conductors 52 in exemplary embodiments have gate lengths between 5-30 nm, although lesser and greater lengths may also be contemplated.

Gate structure formation begins by first forming the gate dielectric portions 50 that adjoin the dielectric layer 34 and the nanowires 46. The gate dielectric portions 50 may comprise a semiconductor oxide (such as, for example, silicon dioxide) or a high k material having a dielectric constant greater than silicon dioxide. Exemplary high k dielectrics include, but are not limited to, $HfO_2$, $ZrO_2$, $La_2O_3$, $Al_2O_3$, $TiO_2$, $SrTiO_3$, $LaAlO_3$, $Y_2O_3$, $HfO_xN_y$, $ZrO_xN_y$, $La_2O_xN_y$, $Al_2O_xN_y$, $TiO_xN_y$, $SrTiO_xN_y$, $LaAlO_xN_y$, $Y_2O_xN_y$, SiON, $SiN_x$, a silicate thereof, or an alloy thereof. Each value of x is independently from 0.5 to 3 and each value of y is independently from 0 to 2.

The gate dielectric portions 50 can be formed by any suitable deposition technique including, for example, chemical vapor deposition (CVD), plasma enhanced chemical vapor deposition (PECVD), physical vapor deposition (PVD), sputtering, or atomic layer deposition. In one embodiment of the present application, the gate dielectric portions 50 have a thickness in a range from 1 nm to 10 nm. Other thicknesses that are lesser than or greater than the aforementioned thickness range can also be employed for the gate dielectric portion 50 in some embodiments.

As shown in FIG. 5D, the gate structures 48 include the high-k dielectric layers 50 formed on the electrically insulating layer 34 and encasing each of the nanowires 46. FIG. 5D shows the complete encasement of the channel regions of the nanowires by the gate dielectric layers 50, separating them from the surrounding electrically conductive gate material. The gate dielectric layers 50 may include multiple layers, such as a silicon dioxide layer deposited directly on silicon nanowires and a hafnium oxide layer deposited on the silicon dioxide layer. In one or more embodiments, the electrically conductive gate material includes aluminum. The electrically conductive portions 52 and dielectric layers 50 of the gate structures 48 completely surround the channel regions of the nanowires 46. A hard mask layer 54, such as a silicon nitride layer or a silicon oxynnitride layer, is deposited on the electrically conductive gate conductors 52 of the gate structures Spacers 56 (nitride or oxide) are formed on the sidewalls of the gate structures 48, fin structures 42 and pads 40. The thickness of the spacers is about five nanometers in one or more embodiments. The spacers can be formed by depositing a dielectric film such as silicon nitride and etching the dielectric film from all horizontal surfaces by RIE. The spacers are formed around portions of the nanowires that extend from the gate structures 48 as well as around portions of the exposed silicon layers 38 of the fin structures 42. The portions of the nanowires 46 extending within the gaps 66 between gate structures 48 and fin structures 42 are then chopped to form the structure shown in FIGS. 6 and 6A-D. Nanowire chop can be performed using a dry etch process that is selective to silicon. An exemplary selective RIE process is based on the use of hydrogen bromide that etches silicon much more rapidly than dielectric materials such as silicon oxide and silicon nitride. The portions of the nanowires protected by the surrounding gate structure and spacers remain substantially intact. Likewise, the silicon layers 38 within the fin structures 42 and adjoining spacers 50 remain substantially intact.

Figure 7A:
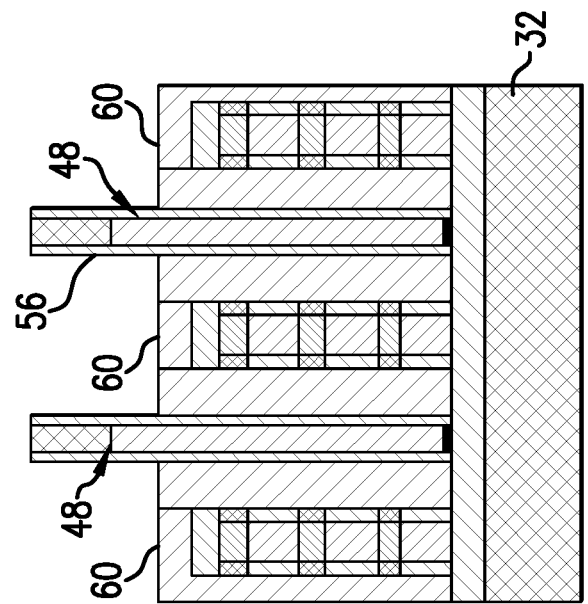
FIGS. 7 and 7A-D are schematic top plan and cross sectional views of the structure shown in FIGS. 6 and 6A-D following hard mask removal, source/drain epitaxy and nanowire merge.
Figure 7:
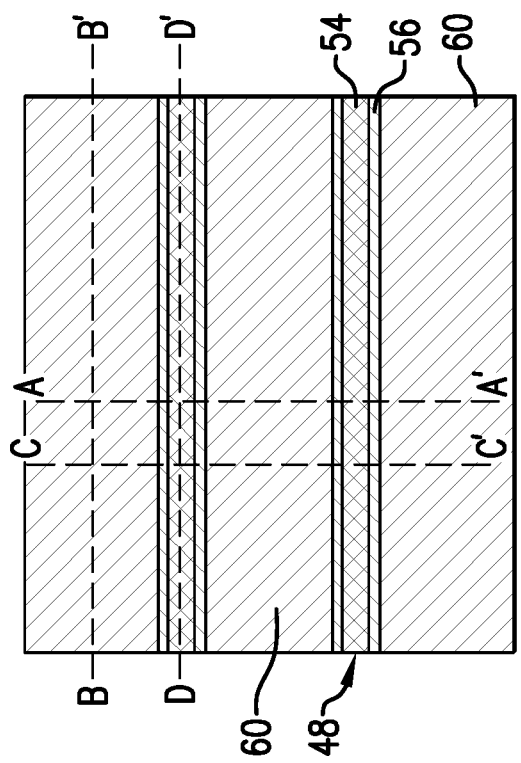
Figure 7D:
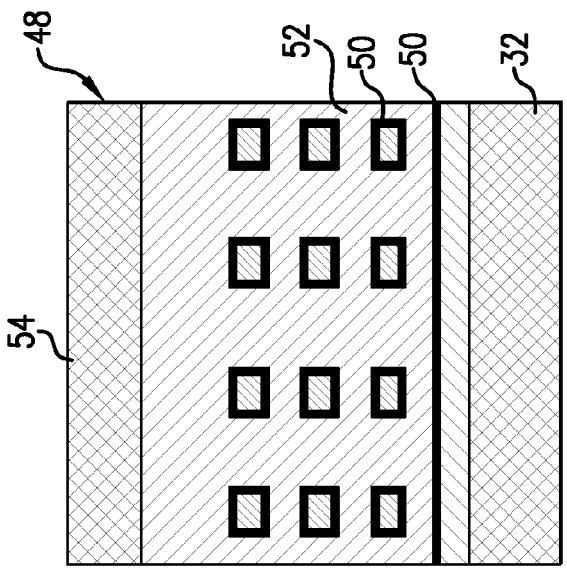
Figure 7B:
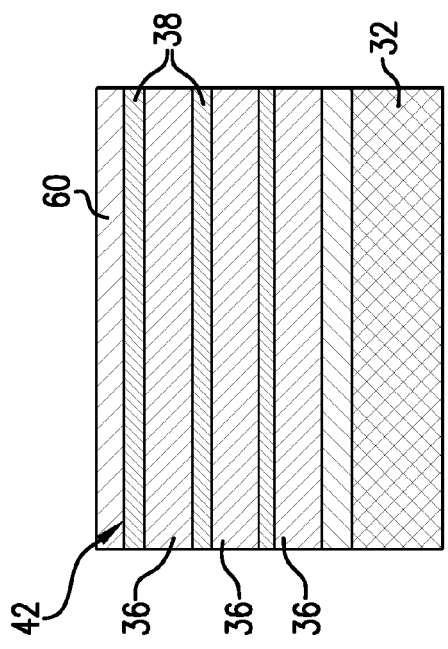
Figure 7C:
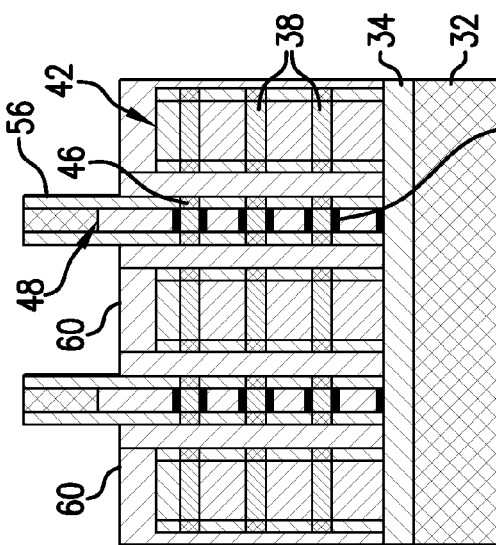

The hard mask formed by the pads 40 is removed and source/drain regions 60 are grown epitaxially in the spaces between the gate structures 48 and fin structures 42. The epitaxial growth further extends over the fin structures 42 as shown in FIGS. 7B and 7D. If silicon nitride is employed for the hard mask, it can be stripped by hot phosphoric acid or HF/EG (hydrofluoric acid/ethylene glycol). The fin structures 42 between adjacent gate structures facilitate merger of the nanowires 46, acting as sources for source/drain epitaxy that helps overcome epitaxial issues due to small (e.g. sub-4 nm) nanowire dimensions. In one or more exemplary embodiments, the gate pitch is 40-80 nm. The widths of the fin structures 42 are selected to facilitate subsequent nanowire merger, as discussed further below with respect to FIG. 9. The height of each nanowire is 5 nm or less. Source/drain epitaxial growth and merging the nanowires would be difficult in the absence of the fin structure 42 due to the small available nanowire surfaces and facet issues. As shown in FIG. 7C, the epitaxial growth causes the source/drain regions to contact both the exposed end portions of the nanowires 46 and the opposing end portions of the semiconductor layers 38 of the fin structures 42. It will be appreciated that a "gate last" process may alternatively be employed rather than the "gate first" process as shown and described herein. A dummy (e.g. polysilicon) gate (not shown), also referred to as a sacrificial gate structure, would be formed over the nanowires 46 prior to source/drain epitaxy, followed by dummy gate and spacer removal and replacement by a functional gate structure. The term "functional gate structure" is used to denote a permanent gate structure used to control output current (i.e., flow of carriers in the channel) of a semiconducting device through electrical or magnetic fields. The term "sacrificial gate structure"

is used to denote a material that serves as a placeholder structure for a functional gate structure to be subsequently formed. In embodiments in which the gate structure is a sacrificial gate structure (not shown in drawings), the sacrificial gate structure is formed by first providing a blanket layer of a sacrificial gate material. The blanket layer of sacrificial gate material can be formed, for example, by chemical vapor deposition or plasma enhanced chemical vapor deposition. The blanket layer of sacrificial gate material can include any material that can be selectively removed from the structure during a subsequently performed etching process. In one embodiment, the blanket layer of sacrificial gate material may be composed of polysilicon. After providing the blanket layer of sacrificial gate material, the blanket layer of sacrificial gate material can be patterned by lithography and etching so as to form the sacrificial gate structure. "Gate last" processes are familiar to those of skill in the art.

Boron doped SiGe regions may be employed to form pFET structures while nFET structures can be formed using phosphorous or arsenic doped silicon or SiGe regions in some exemplary embodiments. In another exemplary embodiment, the source/drain regions 60 are comprised of Si:C (carbon doped Si, with [C]=0.5–4%) and doped with a group V element to form an nFET device. In a silicon-containing substrate, examples of p-type dopants, i.e., impurities include but are not limited to: boron, aluminum, gallium and indium. As used herein, "n-type" refers to the addition of impurities that contributes free electrons to an intrinsic semiconductor. In a silicon containing substrate, examples of n-type dopants, i.e., impurities, include but are not limited to antimony, arsenic and phosphorous. CMOS processing techniques familiar to those of skill in the art may be employed for the deposition of source and drain regions. An in situ doped epi process forms the source/drain regions 60 in some embodiments. A chemical vapor deposition (CVD) reactor may be used to cause the epitaxial growth of chosen materials. Thermal processing may be employed following growth of the source/drain regions to diffuse doping ions into the nanowire regions within the spacers 56.

The source/drain regions can be formed utilizing any suitable epitaxial growth (or deposition) process. The terms "epitaxial growth and/or deposition" and "epitaxially formed and/or grown" mean the growth of a semiconductor material on a deposition surface of a semiconductor material, in which the semiconductor material being grown has the same crystalline characteristics as the semiconductor material of the deposition surface. In an epitaxial deposition process, the chemical reactants provided by the source gases are controlled and the system parameters are set so that the depositing atoms arrive at the deposition surface of the semiconductor substrate with sufficient energy to move around on the surface and orient themselves to the crystal arrangement of the atoms of the deposition surface. Therefore, an epitaxial semiconductor material has the same crystalline characteristics as the deposition surface on which it is formed.

Examples of various epitaxial growth processes that are suitable for use in forming silicon germanium source/drain regions include, rapid thermal chemical vapor deposition (RTCVD), low-energy plasma deposition (LEPD), ultra-high vacuum chemical vapor deposition (UHVCVD), atmospheric pressure chemical vapor deposition (APCVD) and molecular beam epitaxy (MBE). The temperature for epitaxial deposition process for forming silicon germanium alloy typically ranges from 550° C. to 900° C. Although higher temperature typically results in faster deposition, the faster deposition may result in crystal defects.

A number of different source gases may be used for the deposition of silicon germanium source/drain regions 60. In one embodiment, a combination of a silicon source gas and a germanium source gas can be used in forming the layer of silicon germanium alloy. Examples of silicon source gases that can be used include silane, disilane, trisilane, tetrasilane, hexachlorodisilane, tetrachlorosilane, dichlorosilane, trichlorosilane, methyl silane, dimethylsilane, ethyl silane, methyldisilane, dimethyldisilane, hexamethyldisilane and combinations thereof. Examples of germanium source gases that can be used include germane, digermane, halogermane, dichlorogermane, trichlorogermane, tetrachlorogermane and combinations thereof. In some embodiments, a single source gas that includes a silicon component and a germanium component may be used in forming silicon germanium source/drain regions. Carrier gases like hydrogen, nitrogen, helium and argon can be used during the epitaxial growth process.

Substitutional carbon, if employed, can be added by introducing a carbon source gas into the gas mixture that is employed for forming silicon germanium source/drain regions. Examples of carbon source gases that can be used in the present application include, for example, alkylsilanes (such as, for example, mono-methylsilane), alkanes, alkenes, and alkynes.

FIGS. 8 and 8A-C provide schematic views corresponding, respectively, to FIGS. 7 and 7A-C following deposition of a metallized layer 70 over the source/drain region 60. The metallized layer may include copper or other electrical conductors, one or more of which are electrically connected to the transistor structures formed by the gate structures, the source/drain regions, and semiconductor channels, and form electrodes.

Electrodes formed on the transistor structures can be any conductive material including, for example, doped polysilicon, an elemental metal (e.g., tungsten, titanium, tantalum, aluminum, nickel, ruthenium, palladium and platinum), an alloy of at least two elemental metals, an elemental metal nitride (e.g., tungsten nitride, aluminum nitride, and titanium nitride), an elemental metal silicide (e.g., tungsten silicide, nickel silicide, and titanium silicide) or multilayered combinations thereof. The electrode layer can be formed utilizing conventional deposition such as CVD, PECVD, PVD, or ALD, and conventional silicidation if the electrode is a silicide material.

Figure 9:
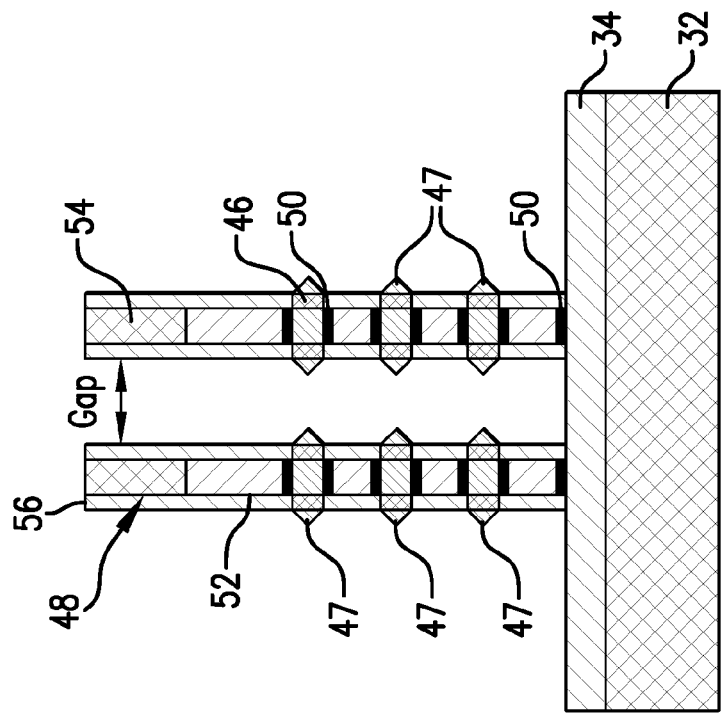
FIG. 9 is a schematic, cross sectional view showing a substrate including gate structures separated by a gap.

As discussed above, the fin structures 42 or pillars have a pitch similar to the gate pitch. Referring below to FIG. 9, two adjoining gate structures 48 similar to those discussed above are shown. No fin structure 42 is shown between the gate structures 48 for purposes of illustration and discussion. Exemplary dimensions are provided for the illustrated structures. The square nanowires 46 of the exemplary structure have widths and heights of five nanometers or less. The gate length $L_G$ is less than ten nanometers. The thickness of the spacers 56 ($T_{spacer}$) is less than five nanometers. The width of the fin structure 42 (auxiliary pillar) $W_{AP}$ (not shown in FIG. 9) is less than ten nanometers in one or more embodiments. Epitaxial growth between the gate structures 48 is very limited as shown in FIG. 9. The epitaxial facets 47 formed on the exposed (111) planes of the nanowires extend only limited distances into the gap between the gate structures and do not merge where the exemplary gate pitch (CPP) is 45-50 nm and the resulting gap between nanowires is about twenty-five nanometers (25 nm). By providing pillars (fin structures 42) of appropriate widths as additional sources for epitaxial growth between the gate structures, the nanowires can be effectively merged to form pFET as well as nFET structures. Such merger is difficult if not impossible if the gap is large. The formulas provided in FIG. 9 relate to structures including auxiliary pillars such as fin structures 42.

Given the discussion thus far and with reference to the exemplary embodiments discussed above and the drawings, it will be appreciated that, in general terms, an exemplary fabrication method includes obtaining a first structure including a base substrate 32, 34, a plurality of gate structures 48 on the base substrate, and a plurality of semiconductor fin structures 42 on the base substrate, each of the gate structures including a gate conductor 52 and one or more nanowires 46 extending through the gate conductor, each fin structure including one or more semiconductor layers 38 and being positioned between a pair of the gate structures 48. An exemplary embodiment of such a structure is shown in FIGS. 6 and 6A-D. The method further includes epitaxially growing source/drain regions 60 between the gate structures 48 such that the source/drain regions contact the one or more nanowires 46 extending through the gate structure and the one or more semiconductor layers 38 of the fin structure 42. FIGS. 7 and 7A-D illustrate source/drain epitaxy on the exemplary structure of FIGS. 6 and 6A-D. One or more embodiments of the method further includes the steps of obtaining a starting substrate 30 including alternating layers 36, 38 of first and second semiconductor materials, the first and second semiconductor materials being selectively etchable with respect to each other, forming the semiconductor fin structures 42 from the alternating layers 36, 38 of first and second semiconductor materials, forming a vertically stacked arrangement of the nanowires 46 from the layers 38 of second semiconductor material, forming the gate structures 48 around the nanowires 46, forming spacers 56 on the fin structures 42 and gate structures 48, and chopping the nanowires 46 outside the gate structures 46. Fin structure formation using an exemplary starting substrate is shown FIGS. 3 and 3A-D. The formation of a vertically stacked arrangement of nanowires 46 from layers 38 of a semiconductor material is shown schematically for an exemplary embodiment in FIGS. 4 and 4A-D. Formation of gate structures 48 around nanowires 46 is shown in FIGS. 5 and 5A-D. FIGS. 6 and 6A-D schematically illustrate the exemplary formation of spacers 56 and the chopping of nanowires 46 outside the gate structures 48. The step of forming the semiconductor fin structures includes, in one or more embodiments, forming a plurality of pads 40 on the starting substrate, such as shown in FIGS. 2 and 2A-B, and removing portions of the starting substrate between the pads. FIGS. 3 and 3A-D illustrate the removal of portions of the semiconductor layers 36, 38 of the starting substrate 30 between the pads. In one or more embodiments, the step of forming the nanowires 46 further includes forming a plurality of fins 44 from the layers 36, 38 of first and second semiconductor materials within the starting substrate, the fins 44 intersecting the fin structures 42 such as shown in FIG. 3A, and selectively etching the layers 36 of first semiconductor material from the fins 44. In some embodiments, the first and second semiconductor materials are silicon germanium and silicon, respectively.

Figure 8A:
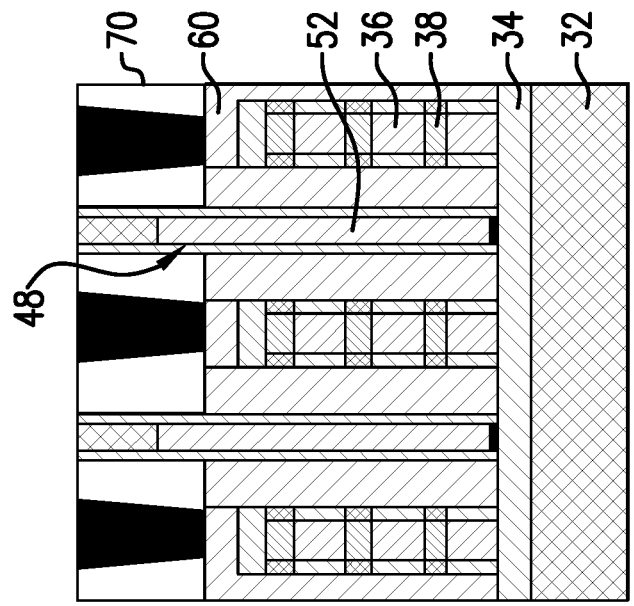
FIGS. 8 and 8A-C are schematic top plan and cross sectional views of the structure shown in FIGS. 7 and 7A-C following metallization.
Figure 8:
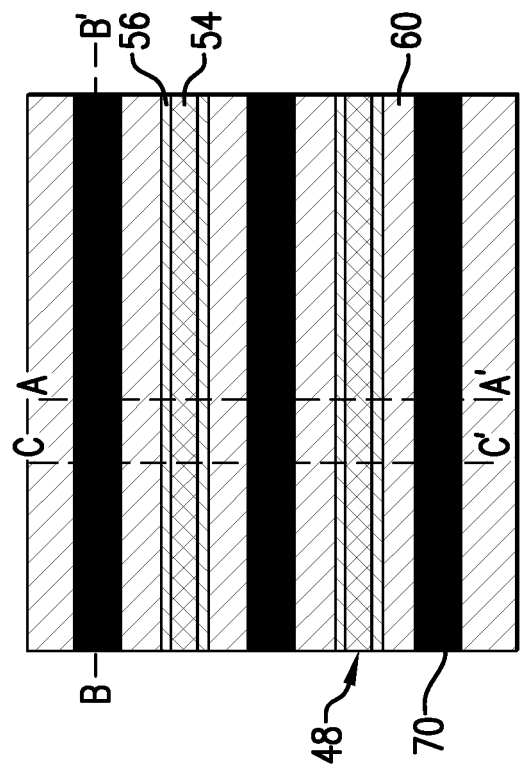
Figure 8C:
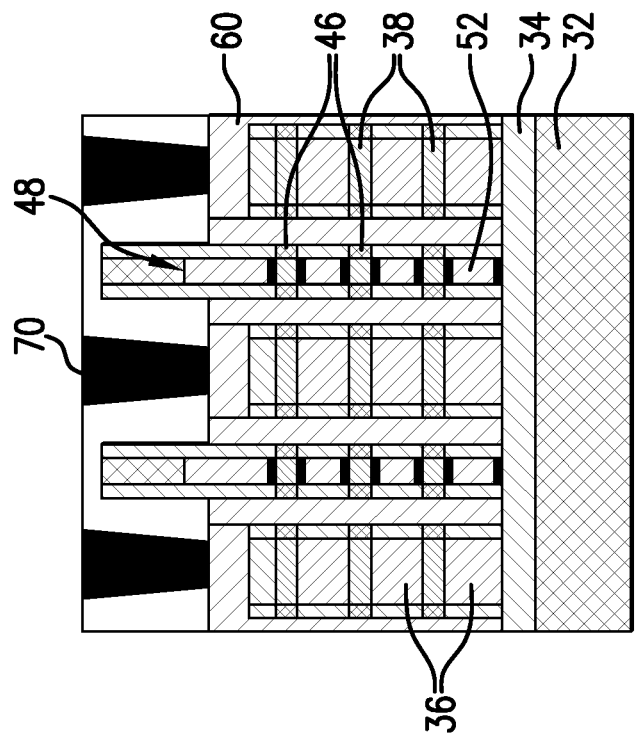
Figure 8B:
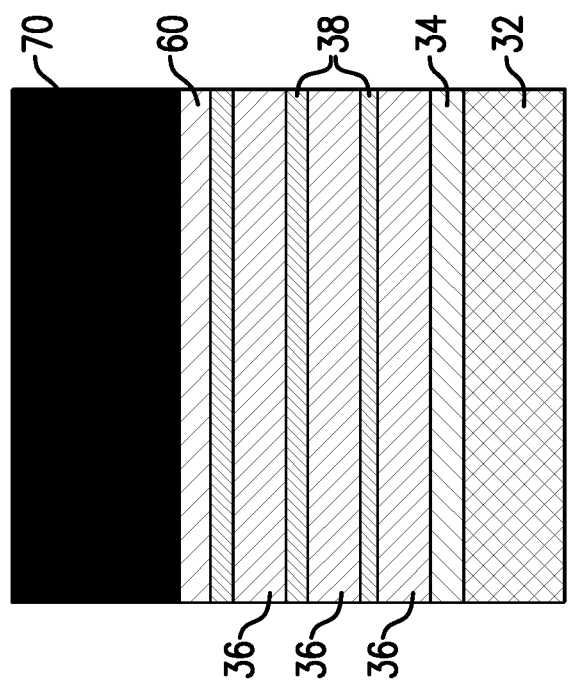

An exemplary gate-all-around nanowire transistor structure in accordance with one or more exemplary embodiments includes a base substrate. An exemplary base substrate includes layers 32 and 34, as shown in FIGS. 7 and 7A-D. The exemplary transistor structure includes a plurality of gate structures 48 on the base substrate, each of the gate structures including a gate conductor 52 and one or more nanowires 46 extending through the gate conductor 52. A plurality of fin structures 42 are provided on the base substrate, each fin structure including an alternating sequence of layers, including one or more semiconductor layers 38. Each fin structure is positioned between a pair of the gate structures 48. Epitaxial source/drain regions between the gate structures contact the one or more nanowires 46 extending through the gate structures and one or more of the plurality of semiconductor layers 38 of the fin structure 42. In some embodiments, each of the gate structures includes a stacked nanowire architecture including a plurality of nanowires 46 extending through the gate conductor 52 and gate dielectric layers thereof, such as shown in FIG. 7C. The layers 36, 38 of each fin structure 42 of one or more exemplary transistor structures include a stack of first layers 36 of a first semiconductor material in alternating sequence with second semiconductor layers 38 of a second semiconductor material different from the first material. The nanowires 36 are comprised of the second semiconductor material in exemplary embodiments. The second semiconductor layers 38 of each fin structure are in opposing relation to and aligned with, respectively, the nanowires 46 extending through the gate conductors 52 of adjoining gate structures 48 in some embodiments, as best shown in FIGS. 7C and 8C.

A further exemplary structure is provided for facilitating the fabrication of gate-all-around nanowire transistor structures. Such a structure includes a base substrate (such as the layers 32, 34) and a plurality of gate structures 48 on the base substrate. Each of the gate structures includes a gate conductor 52 and a stacked nanowire architecture including a plurality of nanowires 46 extending through the gate conductor 52 thereof, the gate structures being separated by gaps 66. Fin structures on the base substrate are in alternating sequence with the gate structures and include an alternating sequence of first layers 36 and second semiconductor layers 38. The second semiconductor layers 38 are integral with the nanowires 46 which extend through the gaps 66, as shown in FIG. 5C. The first layers 36 are semiconductor materials in one or more embodiments. Parallel, vertically extending gate structures and fin structures as formed in the exemplary embodiments facilitate further processing.

Those skilled in the art will appreciate that the exemplary structures discussed above can be distributed in raw form or incorporated as parts of intermediate products or end products that benefit from having CMOS devices therein.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, steps, operations, elements, and/or components, but do not preclude the presence or addition of one or more other features, steps, operations, elements, components, and/or groups thereof. Terms such as "above" and "below" are used to indicate relative positioning of elements or structures to each other as opposed to relative elevation.

The corresponding structures, materials, acts, and equivalents of all means or step plus function elements in the claims below are intended to include any structure, material, or act for performing the function in combination with other claimed elements as specifically claimed. The description of the various embodiments has been presented for purposes of illustration and description, but is not intended to be exhaustive or limited to the forms disclosed. Many modifications and variations will be apparent to those of ordinary skill in the art without departing from the scope and spirit of the invention. The embodiments were chosen and described in order to best explain the principles of the invention and the practical application, and to enable others of ordinary skill in the art to understand the various embodiments with various modifications as are suited to the particular use contemplated.

What is claimed is:

1. A transistor structure comprising:
   a base substrate;
   a plurality of gate structures on the base substrate, each of the gate structures including a gate conductor and one or more nanowires extending through the gate conductor, each of the one or more nanowires having an exposed end portion;
   a plurality of fin structures on the base substrate, the fin structures being parallel to the gate structures, each fin structure including an alternating sequence of first layers and at least one second semiconductor layer and being positioned between a pair of the gate structures, the one or more nanowires and the at least one second semiconductor layer being comprised of the same material, and
   epitaxial source/drain regions between the gate structures, the epitaxial source/drain regions contacting the exposed end portions of the one or more nanowires extending through the gate conductors and the at least one second semiconductor layer of the fin structures.

2. The transistor structure of claim 1, wherein the first layers of the fin structures are comprised of a first semiconductor material and the at least one second semiconductor layer is comprised of a second semiconductor material different from and selectively etchable with respect to the first semiconductor material.

3. The transistor structure of claim 2, wherein each of the gate structures includes a stacked nanowire architecture including a plurality of nanowires extending through the gate conductor thereof and each fin structure includes a plurality of second semiconductor layers stacked in alternating sequence with the first layers.

4. The transistor structure of claim 3, wherein the second semiconductor layers of each fin are in opposing relation to and aligned with, respectively, the nanowires extending through the gate conductors of adjoining gate structures.

5. The transistor structure of claim 4, further including an electrically conductive contact on the source/drain regions.

6. The transistor structure of claim 5, wherein the base substrate includes an electrically insulating layer, the gate structures and fin structures adjoining the electrically insulating layer.

7. The transistor structure of claim 1, further including spacers adjoining the fin structures and gate structures, the one or more nanowires including regions within the spacers adjoining the gate structures and the one or more second semiconductor layers including regions within the spacers adjoining the fin structures.

8. A structure comprising:
   a base substrate;
   a plurality of gate structures on the base substrate, each of the gate structures including a gate conductor and a stacked nanowire architecture including a plurality of nanowires extending through the gate conductor thereof, the gate structures being separated by gaps;
   a plurality of fin structures on the base substrate in alternating sequence with and parallel to the gate structures, each fin structure including an alternating sequence of first layers and second semiconductor layers, the second semiconductor layers being integral with the nanowires.

9. The structure of claim 8, wherein the first layers of the fin structures are comprised of a first semiconductor material, the second semiconductor layers of the fin structures are comprised of a second semiconductor material different from the first semiconductor material, and the nanowires are comprised of the second semiconductor material.

10. The structure of claim 9, wherein the gate structures have a pitch between 40-80 nm.

11. The structure of claim 10, wherein the nanowires have height dimensions of five nanometers or less.

12. The structure of claim 11, further including dielectric sidewall spacers on the gate structures and fin structures, the sidewall spacers extending around portions of the nanowires and portions of the second semiconductor layers.

* * * * *